United States Patent [19]
Mi et al.

[11] Patent Number: 5,608,669
[45] Date of Patent: Mar. 4, 1997

[54] FAST INTERNAL REFERENCE CELL TRIMMING FOR FLASH EEPROM MEMORY

[75] Inventors: James Q. Mi, Sunnyvale; Johnny Javanifard, Sacramento; Dennis Dilley, Fair Oaks, all of Calif.

[73] Assignee: Intel Corporation, Santa Clara, Calif.

[21] Appl. No.: 599,123

[22] Filed: Feb. 9, 1996

Related U.S. Application Data

[60] Continuation of Ser. No. 509,834, Aug. 1, 1995, abandoned, which is a division of Ser. No. 252,693, Jun. 2, 1994, abandoned.

[51] Int. Cl.$^6$ .............................. G11C 7/00; G11C 29/00
[52] U.S. Cl. .................. 365/185.19; 365/185.22; 365/185.33; 365/189.07; 365/201; 365/210
[58] Field of Search .............................. 365/201, 189.07, 365/185.22, 185.33, 210, 185.19

[56] References Cited

U.S. PATENT DOCUMENTS

| | | | |
|---|---|---|---|
| 4,357,685 | 11/1982 | Daniele et al. | 365/189 |
| 4,460,982 | 7/1984 | Gee et al. | 365/189 |
| 5,053,990 | 10/1991 | Kreifels et al. | 364/900 |
| 5,218,569 | 6/1993 | Banks | 365/189.01 |
| 5,222,046 | 6/1993 | Kreifels et al. | 365/230.06 |
| 5,371,703 | 12/1994 | Miyamoto | 365/210 X |
| 5,381,374 | 1/1995 | Shiraishi et al. | 365/210 X |
| 5,386,388 | 1/1995 | Atwood et al. | 365/201 |
| 5,394,362 | 2/1995 | Banks | 365/189.01 |
| 5,394,371 | 2/1995 | Hoffa | 365/210 X |
| 5,444,656 | 8/1995 | Bauer et al. | 365/189.01 |

*Primary Examiner*—Do Hyun Yoo
*Attorney, Agent, or Firm*—Blakely, Sokoloff, Taylor & Zafman

[57] ABSTRACT

A method for storing a charge on memory devices which includes the steps of providing a first charging pulse to a memory device to charge the device to a first level less than a final level; testing the value of the charge to determine whether the charge is greater than the first level; if the value of the charge is less than the first level, providing a second set of charging pulses to the memory device, each of the pulses of the second set of pulses having a duration which is a fraction of the duration of the first pulse and a value sufficient to charge the device to the first level; testing the value of the charge to determine whether the charge is greater than the first level after each pulse of the second set of pulses; and once the charge has tested greater than the first level, providing a third set of charging pulses to terminals of the memory device, each of the pulses of the third set of pulses having a duration which is a fraction of the duration of the pulses of the second set of pulses and a value such that the charge furnished by each pulse is approximately equal to an allowable variation of the charge from the final value.

6 Claims, 6 Drawing Sheets

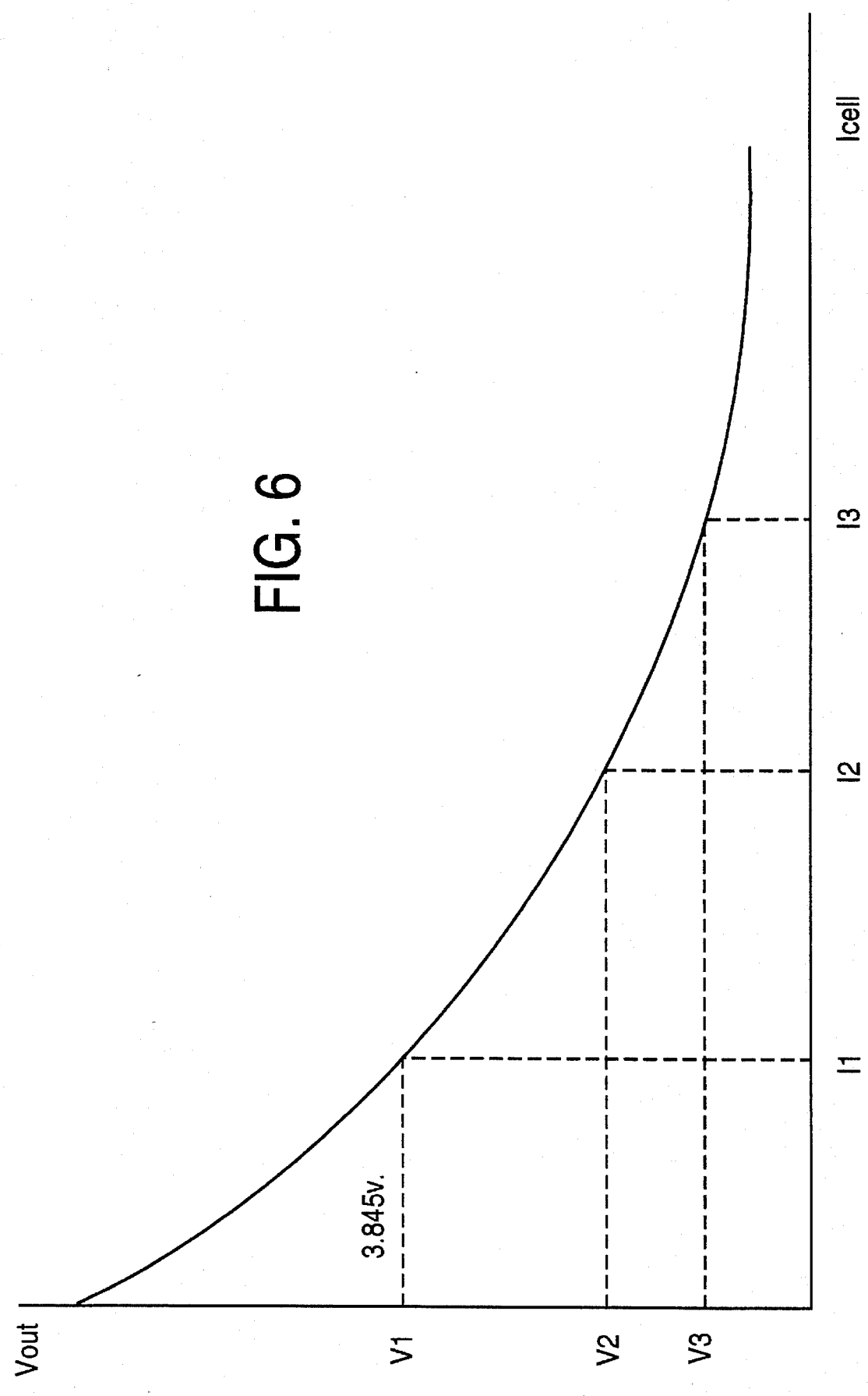

FAST INTERNAL REFERENCE CELL TRIMMING FOR FLASH EEPROM MEMORY

This is a continuation of application Ser. No. 08/509,834, filed Aug. 1, 1995, now abandonded which is a divisional of application Ser. No. 08/252,693, filed Jun. 2, 1994, now abandonded.

BACKGROUND OF THE INVENTION

1. Field of the Invention

This invention relates to computer systems, and more particularly, to methods and apparatus for rapidly and accurately trimming the values stored by reference cells used for reading flash EEPROM memory.

2. History of the Prior Art

Recently, flash electrically-erasable programmable read only memory (flash EEPROM memory) has been used as a new form of long term storage. A flash EEPROM memory array is constructed of floating gate field effect transistor devices. Such memory transistors may be programmed by storing a charge on the floating gate. The condition (programmed or erased) may be detected by interrogating the cells. An example of a flash EEPROM memory array which may be used in place of a hard disk drive is given in U.S. patent application Ser. No. 07/969,131, entitled *A Method and Circuitry For A Solid State Memory Disk*, S. Wells, filed Oct. 31, 1992, and assigned to the assignee of the present invention. These arrays provide a smaller lighter functional equivalent of a hard disk drive which operates more rapidly and is not as sensitive to physical damage. Such memory arrays are especially useful in portable computers where space is at a premium and weight is extremely important.

Recently, it has been discovered that the transistor devices used for flash EEPROM memory arrays may be made to store more than two conditions. Essentially, four or more distinct levels of charge may be stored on the floating gate of the devices by varying the voltages applied to the terminals of the devices; and these different levels may be detected. This allows flash EEPROM devices in memory arrays to store more than one bit per device and radically increases the storage capacity of such arrays.

Flash EEPROM arrays, like other transistor memory arrays utilize reference devices to store values against which the memory cells are tested to determine their condition when the memory cells are read. These reference devices are typically flash EEPROM devices similar to those used for storing data in the array. In a typical memory array in which two possible conditions are available for each memory cell, the reference devices are programmed into a condition to produce a particular current value when interrogated which is midway between the two conditions of the memory cells. The current through the reference device in turn produces a voltage which is measured against a voltage produced by current through a memory cell. The condition of the reference device need not be programmed especially accurately because there is a large margin for error between the two states of the memory cells which the reference device is used to measure. Consequently, this condition has normally been programmed using gate and drain voltages unrelated to operation of the array to obtain a desired current value through the reference devices. Typically, this programming has been a relatively slow process due to the need to program and test repeatedly until a correct current is realized.

With the new storage arrangements in which more than one bit may be stored by each memory transistor, many more reference cells are utilized since many more levels must be tested to determine a value stored by the floating gate of a memory cell. Since a number of voltage levels must be measured, the values stored by the reference cells need to be very accurately determined. It would be useful if this could be accomplished by a process which could be rapidly consummated.

SUMMARY OF THE INVENTION

It is, therefore, an object of the present invention to provide an improved method and apparatus for placing reference cells used in flash EPROM memory arrays in a proper condition.

It is another more specific object of the present invention to provide a more rapid method for placing reference cells used in flash EPROM memory arrays in a proper condition.

These and other objects of the present invention are realized in a method for storing a charge on memory devices which includes the steps of providing a first charging pulse to a memory device to charge the device to a first level less than a final level; testing the value of the charge to determine whether the charge is greater than the first level; if the value of the charge is less than the first level, providing a second set of charging pulses to charge the memory device close to the first level, each of the pulses of the second set of pulses having a duration which is a fraction of the duration of the first pulse and a value incrementally greater than the preceding pulse; testing the value of the charge to determine whether the charge is greater than the first level after each pulse of the second set of pulses; and once the charge has tested greater than the first level, providing a third set of charging pulses to the memory device until the final charge level has been reached, each of the pulses of the third set of pulses having a duration which is a fraction of the duration of the pulses of the second set of pulses and a value equal to the value of the preceding pulse such that the charge furnished by each pulse is approximately equal to an allowable variation of the charge from the final value.

These and other objects and features of the invention will be better understood by reference to the detailed description which follows taken together with the drawings in which like elements are referred to by like designations throughout the several views.

BRIEF DESCRIPTION OF THE DRAWINGS

FIG. 6 is a diagram illustrating the voltage current characteristics of an element of the circuit of FIG. 4.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
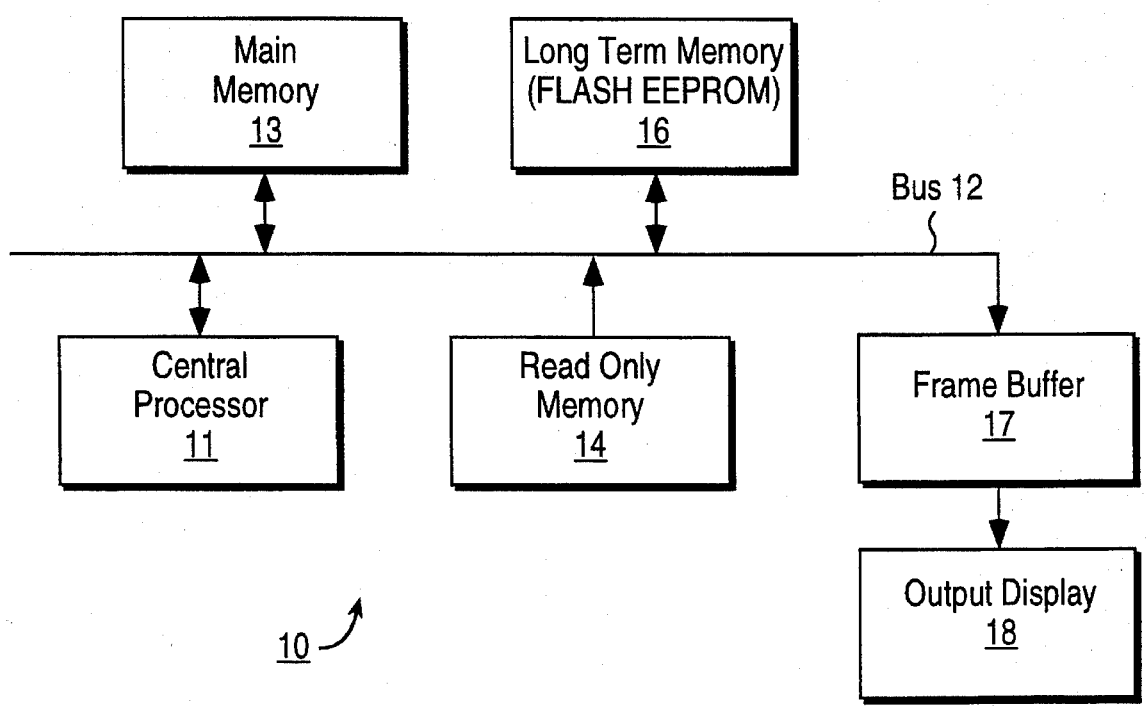
FIG. 1 is a block diagram of a computer system which may include the present invention.

Referring now to FIG. 1, there is illustrated a computer system 10. The system 10 includes a central processing unit 11 which executes the various instructions provided to control the operations of the computer system 10. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such read only memory 14 may be constructed of flash EEPROM memory transistors adapted to be modified as various ones of the BIOS processes used by a particular computer system are changed.

Also connected to the bus 12 are various peripheral components such as long term memory 16 and circuitry such as a frame buffer 17 to which data may be written which is to be transferred to an output device such as a monitor 18 for display. Rather than the electro-mechanical hard disk drive which is typically used for long term memory, a flash EEPROM memory array may be used as the long term memory 16. Such flash EEPROM memory arrays typically includes circuitry for controlling the operation of the memory array including all of the operations associated with programming and erasing the memory array. Such a flash EEPROM memory array is described in detail in the copending patent application mentioned above.

Figure 2:
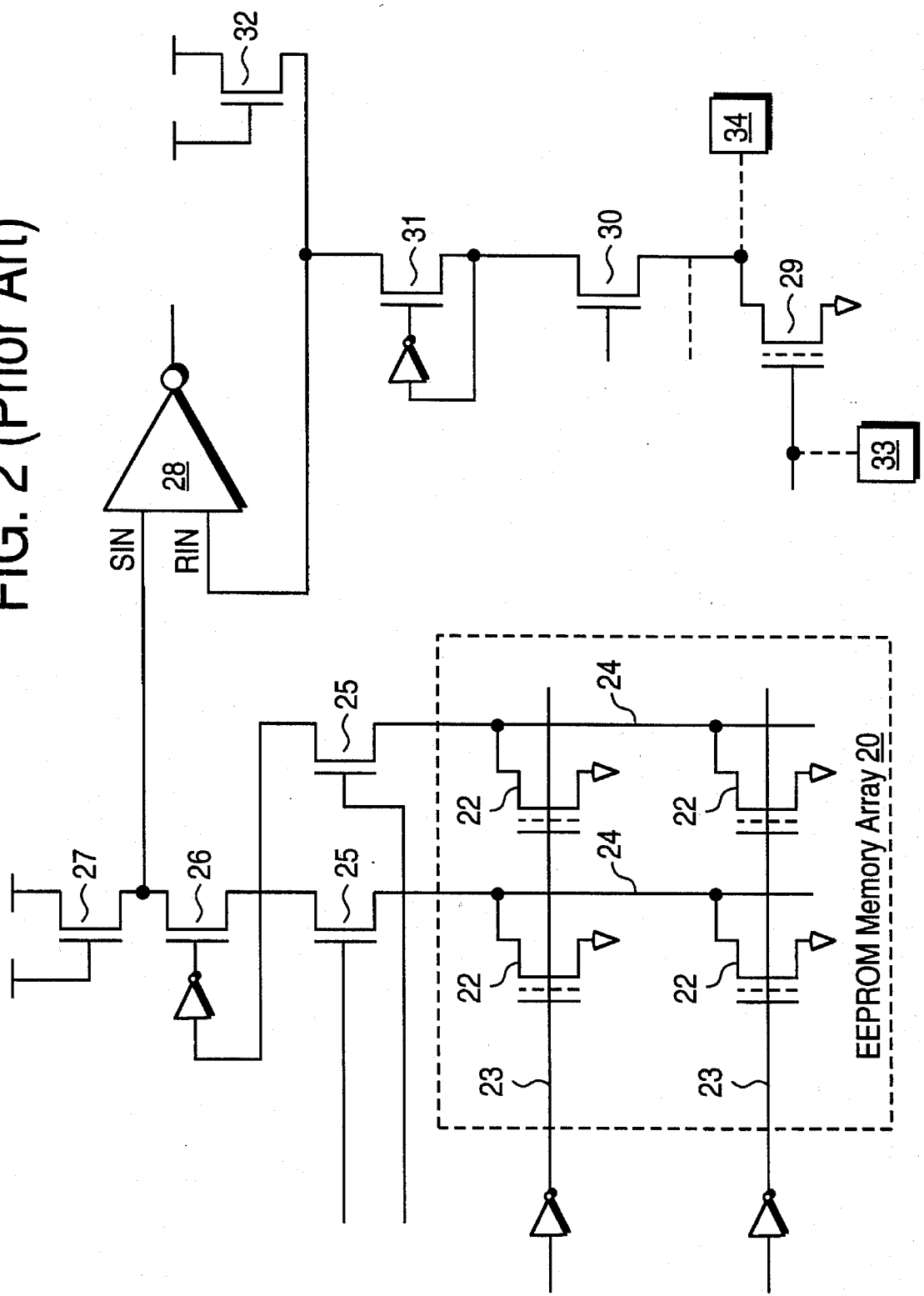
FIG. 2 is a circuit diagram of a portion of a prior art flash EEPROM memory array.
Figure 3:
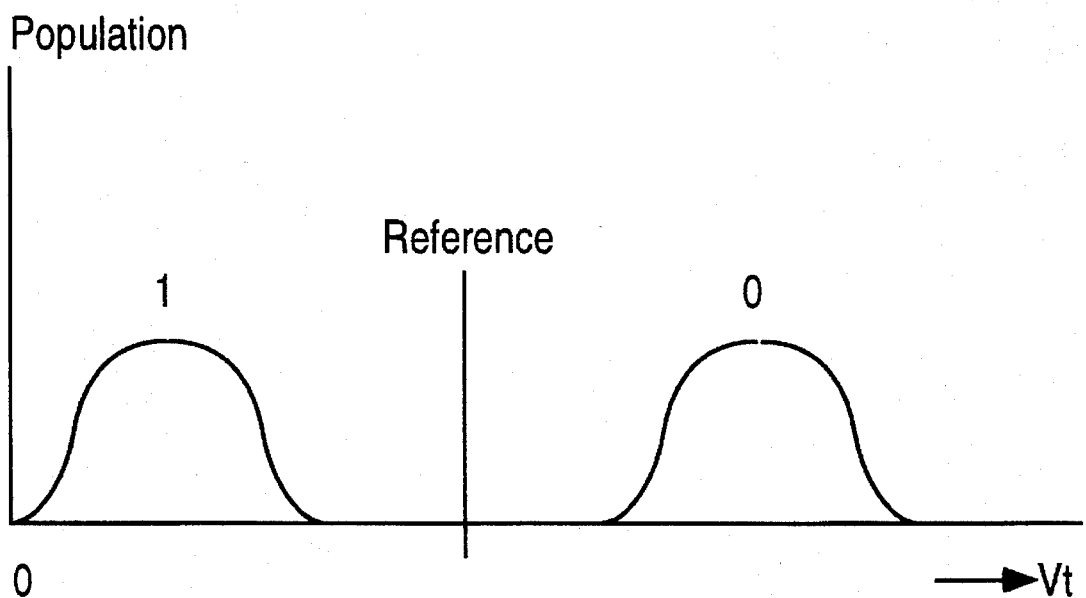
FIG. 3 is a diagram illustrating voltage/current conditions of flash EEPROM memory transistors in the array of FIG. 2 when storing a single bit of data.
Figure 5:
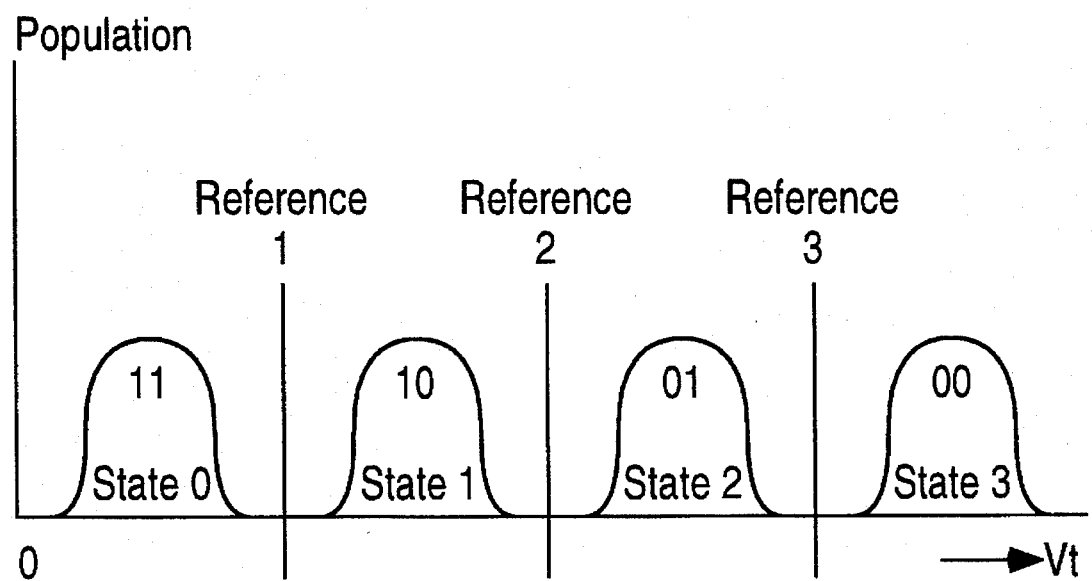
FIG. 5 is a diagram illustrating voltage/current conditions of flash EEPROM memory transistors in the array of FIG. 4 when storing multiple bits of data.

A flash EEPROM memory array is constructed of floating gate field effect transistor devices. Such memory transistors may be programmed to change the charge stored on the floating gate, and the condition (programmed or erased) may be detected by interrogating the cells. FIG. 2 illustrates a portion of a typical flash EEPROM memory array constructed in accordance with the teaching of the prior art. As may be seen in FIG. 2, the array 20 includes a plurality of floating gate field effect transistor devices 22 arranged in rows and columns. Although not shown in detail, circuitry is provided for addressing any particular device 22 by selecting a particular row and column. Typically, an N type device 22 is erased (placed in a one condition) by applying a value such as twelve volts to the source terminal while grounding the gate terminal and floating the drain terminal. When a device is erased, any charge on the floating gate is tunneled from the floating gate. A device 22 is selectively placed in the zero or programmed condition by placing approximately twelve volts on the gate terminal, approximately six volts on the drain terminal, and ground on the source terminal. A device which is programmed has a substantial charge placed on its floating gate. The condition of a device 22 is read by detecting the charge on the floating gate. This is accomplished by placing approximately five volts on the gate terminal, a bias voltage through a cascode device and feedback on the drain terminal, and grounding the source terminal. As is shown in FIG. 3 which illustrates the population of devices 22 having particular threshold voltages in the erased and programmed conditions, when a device 22 is functioning within tolerances, the gate-source voltage is greater than the threshold voltage Vt of the erased cells and is less than the threshold voltage Vt of the programmed cells. Thus, a device 22 which has been programmed with a substantial charge on the floating gate conducts less current while a device which has been erased will transfer a substantially greater amount of current.

In order to determine the charges which are stored by the floating gates of each of the memory transistors in a flash EEPROM array, reference devices are utilized. These reference devices are floating gate field effect transistor devices essentially identical to the memory transistors. The reference devices are programmed to precise values by placing charges on the floating gates. When the memory cells are read, the value of the charge stored by each memory transistor is tested against the value of the charge stored by the reference cells to determine the condition (state) of the memory cell. In a typical flash EEPROM memory array in which only two possible conditions are available for each memory cell, the reference devices are programmed to states midway between the programmed and erased states of the memory cells to produce a particular value when interrogated. This state need not be determined especially accurately (although it should be sufficiently accurate to produce a reference voltage typically within 70 millivolts of the threshold voltage Vt) because there is a large range between the two states of the memory cells and thus a large margin for error. Consequently, this condition has normally been programmed in a separate reference cell programming mode by placing programming voltages on the terminals of the reference devices and programming to obtain a desired current value through the devices. This desired current level is reached by raising the gate voltage to an appropriate level until the desired current is attained and read by external testing circuitry. In prior art arrangements, the programming of the reference cell occurs in a programming mode while the measurement of current through the reference cell occurs in an external testing mode. Programming a reference cell to a proper level requires switching between programming and testing modes until the proper current is obtained. Typically, this has been a relatively slow process because it requires repeated programming and testing until a correct current is reached.

In FIG. 2, the typical arrangement of memory transistors 22 for reading memory cells in prior art arrangements is illustrated. As may be seen, each memory transistor 22 has its gate terminal joined to a wordline 23, its source terminal connected to ground, and its drain terminal connected to a bitline 24. A N type FET transistor device 25 is arranged as a column select device to allow any particular column to be selected. The drain terminals of the devices 25 are joined through a N type device 26 connected in a cascode arrangement to provide drain bias for the devices 22. The drain terminal of the device 26 is connected to a N type device 27 (which may be a device having a low threshold voltage Vt) joined to Vcc. When five volts is applied to the gate terminal of a particular device 22 in a selected column, that device 22 transfers current if five volts is greater than the threshold voltage Vt produced by the charge stored on its floating gate and does not transfer a current if five volts is less than the threshold voltage Vt. If the device 22 transfers current, this current causes voltage drops across the device 26 and the device 27. The voltage at the drain terminal of the device 26 is furnished to one input of a sense amplifier 28. The sense amplifier 28 receives at its other input a voltage generated in response to a current through a reference transistor 29 arranged in a similar current path with devices 30, 31, and 32 which are chosen to be identical to the devices 25, 26, and 27. If the current through the device 22 being read is greater than the current through the reference device 29, the sense amplifier 28 produces one output signal. If the current through the device 22 being read is less than the current through the reference device 29, the sense amplifier 28 produces a different output signal.

In prior art arrangements such as that illustrated in FIG. 2, the levels to which the memory transistors 22 are programmed are typically quite widely separated as is illustrated in FIG. 3. Because of this, the reference cell programming need not produce too accurate a value. Heretofore, the reference devices 29 have been programmed to provide a reference value by applying a first voltage level Vpx to the gate terminal and a second programming voltage level Vpy to the drain terminal through programming circuitry external to the circuit 20 illustrated (represented by pads 33 and 34) and raising the value of Vpx until a particular level of current (e.g., 10 microamperes) is obtained through the reference device when the reference device is read.

On the other hand, the memory devices 22 are programmed in an entirely different manner than are the reference devices 29. The devices 22 are programmed by applying programming voltages to change the charge stored on the floating gate so that when the condition of a device 22 is read the voltage level at the input to the sense amplifier 28 produced by the current through the device 22 is just sufficient to switch the amplifier 28 to the other state.

With the new storage arrangements in which more than one bit may be stored by each memory transistor 22, many more reference cells are utilized since many more levels must be tested to determine a value stored by the floating gate of a memory cell. Since a number of levels must be measured and the levels of charge between levels are relatively narrow, the values stored by the reference cells need to be very accurately determined in the new arrangements.

The arrangement provided by the prior art for programming reference cells does not provide the accuracy necessary to determine the different levels of charge which may be stored by the memory transistors. More particularly, the programming of the reference devices is accomplished by voltages applied to the terminals of the reference transistors and varied to obtain a measured current value in an operation unrelated to the circuitry utilized in reading the memory cells. On the other hand, the memory devices are programmed to a correct level and the programming verified by measuring the voltage level caused by the current due to the charge on the memory transistor at one input to the sense amplifier against the voltage level produced by current through the reference cell at the other input to the sense amplifier.

Because the methods of verifying the results of the programming of memory and reference devices differ, the programming of the reference devices is not verified with sufficient accuracy that changes in process, temperature, and the like will not affect the levels at which the sense amplifiers read of the memory cells. For example, since the voltage drop across the devices 27 and 32 is determined as a square root of the current through the devices, the accuracy of the measurement by the sense amplifier 28 will be radically affected by changes in process, temperature, or other characteristic which affect any portion of the circuit which varies the currents through these devices. Since the current through the reference cells ultimately controls the current through these devices, the manner of trimming the reference cell values without relation to other elements in the circuit is just not sufficiently accurate for multiple bit memory cells.

Figure 4:
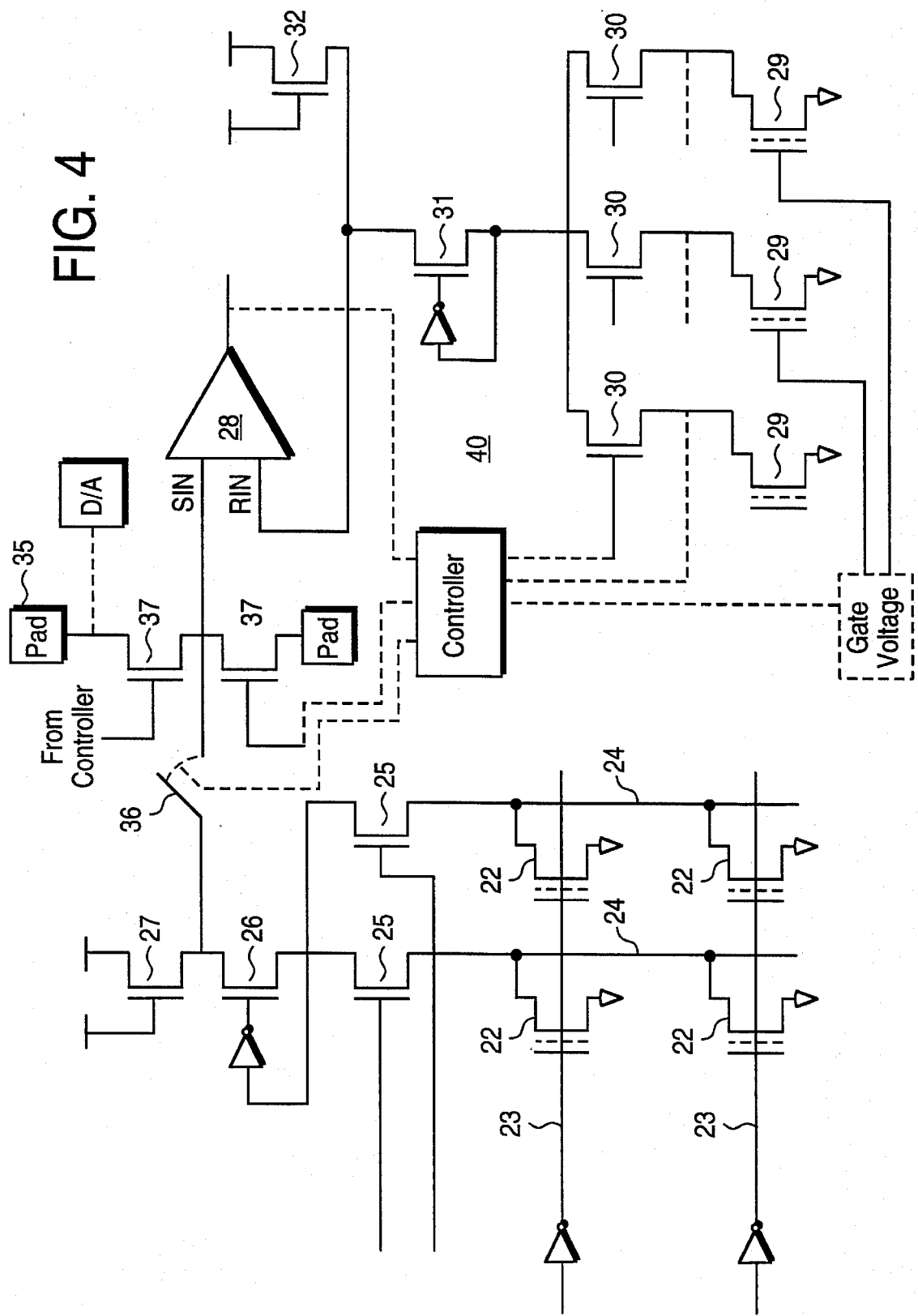
FIG. 4 is a more detailed block diagram of a memory array in accordance with the present invention.

FIG. 4 illustrates an arrangement in accordance with the present invention for verifying the charges stored on floating gates of the reference cells so that a plurality of bits may be stored by a flash EEPROM memory transistor. This same arrangement may be utilized to more accurately verify the trimming of reference cells used in other types of memory arrays or for other purposes where accuracy is especially important.

As may be seen, the circuit 40 of FIG. 4 includes many of the same elements as the circuit of FIG. 2. Memory devices 22 have their gate terminals joined to wordlines 23 and their drain terminals connected to bitlines 24. A selection transistor 25 selects the cells 22 of a particular column for connection through a cascode device 26 to a column load device 27. The voltage level between the device 27 and the device 26 is furnished to a sense amplifier 28 during a read operation. A plurality of reference devices 29 are connected so that each may be joined through a selection device 30 and a cascode device 31 to a reference column load device 32. The voltage level at the node between the device 32 and the device 31 is furnished to the sense amplifier 28 during a read operation.

As may be seen, a number of different reference devices 29 may be provided with their floating gates programmed to different levels to allow the value of the charge stored on any device 22 to be tested against different reference levels. Each of these reference devices 29 is connected in the same manner. By enabling a particular device 30, the desired one of the reference devices 29 may be connected so that the voltage produced by the current through it may be used at the RIN terminal of the sense amplifier 28.

In order to allow the reference devices to be very accurately trimmed and verified, a voltage level is provided at the SIN terminal of the sense amplifier 28. This voltage value may be furnished from a direct connection from an external pad such as the pad 35 illustrated. In some embodiments of the circuitry with which the present invention is utilized, a digital-to-analog converter circuit is provided as a part of the circuitry of the integrated circuit of which the memory array is a portion. Such a circuit may also be utilized to furnish an accurate voltage through a connection to the SIN terminal.

In order to provide a correct voltage value at the SIN terminal so that the internal elements of the circuitry affecting the value of the voltage at the RIN terminal of the sense amplifier 28 are all considered during trimming of the reference devices 29, a means such as a switch 36 (preferably a transistor switch) is provided for disconnecting the array from the sense amplifier during setup. In this manner the array will have no affect on the trimming of the reference devices 29. Alternatively, the array might be disabled in some other manner during the period in which the reference values are established.

In order to assure that correct values are provided at the SIN terminal for each individual reference transistor 29, the voltage-current characteristics of the devices 27 are carefully evaluated at the current levels at which the devices 22 may be read. Thus, as is shown in FIG. 6, for different values of currents through the devices 22, different values of voltage are dropped across the device 27. In contrast to the general levels typically applied during programming (e.g., 1, 1.2, 3.2 v.), these voltages may be very precisely determined. By selecting the voltages furnished at the SIN terminal of the sense amplifier 28 from the pad 35 or from the digital-to-analog converter to match the desired ones of these voltage values, the charges stored on each of the devices 29 may be very precisely adjusted.

Thus, if it is desired to set a reference device 29 to a value such that it may be used to measure a current of $I_1$, then a voltage value of $V_1$ (e.g., 3.845 v.) is selected and applied to the SIN terminal through the switch 37. The device 29 is then programmed by the application of voltages at its terminals until the sense amplifier 28 switches state. This provides a precise point for charge stored on the reference device 29 which takes into account all of the elements in the circuit 40 particularly including the elements 30, 31, and 32. Thus, knowing the exact value of current to be produced by the devices 22 is a particular state allows the precise value of the voltage to be dropped across the device 27 to be determined and applied to the SIN terminal and measured against the value of the voltage at the RIN terminal caused by the current through the device 29. The charges to be placed on the other reference devices 29 in order to provide the desired number of reference values are determined in a similar manner. For example, voltages $V_2$ and $V_3$ may be determined and utilized to set the charge programmed on the floating gates of two other reference devices 29 in an array in which the memory cells each allow four possible states and thus are capable of storing two bits of information.

As has been pointed out above, an array which is capable of storing a plurality of bits in each of the memory devices must utilize many more reference devices than does an array in which each device stores only a single bit of data. Even so, the operation by which the reference devices 22 are placed in the correct states to allow reading of the array must take place rapidly to reduce the cost of manufacturing an array. The present invention provides a method for accomplishing this. This method is especially useful when implemented in an arrangement such as that described in the aforementioned patent application entitled *A Method and Circuitry For A Solid State Memory Disk*, which includes as a portion of the flash EEPROM memory array a controller which may be a microprocessor for providing control signals. Such a controller may be utilized to operate the various switching devices of the array for rapid trimming and verification of the reference devices of the array is accordance with the process described below.

In order to rapidly program the reference devices, the reference cells are trimmed in two stages. In the first stage, a reference cell is trimmed to pass a secondary target reference value at a relatively fast speed. First a long pulse having a high voltage is applied to the gate of the reference device. Subsequently, shorter pulses of gradually increasing voltage are applied to the gate to gradually move the reference charge toward the desired value. In the second stage, shorter pulses of the same final value are applied to gradually move the cell to the correct reference value and past the final target reference value. This method has a number of advantages. First, the initial gate pulse is sufficient to move the reference device through the linear range of operation and into the saturation range. In this saturation range, changes in gate voltage have much less effect in charging the reference device so that charging may be closely controlled. Moreover, changes in gate voltage have a one-to-one relationship to the change in the threshold voltage in this range so that the increase in the charge brought about by the amount of the change in the voltage of the charging pulse may be relatively precisely calculated. Second, by shifting the charge from the lower side and applying values less than the value of the charge desired, the charge stored can be tested at each step. Since the latter steps of programming move the charge by no more than the value of accuracy desired for the reference voltage, the point at which a test shows that the sense amplifier has switched is a correct point for the reference charge and provides very rapid programming. This is especially true when the selection of pulses to apply and testing are conducted under control of an internal controller which is associated with the integrated circuit memory array.

Figure 7:
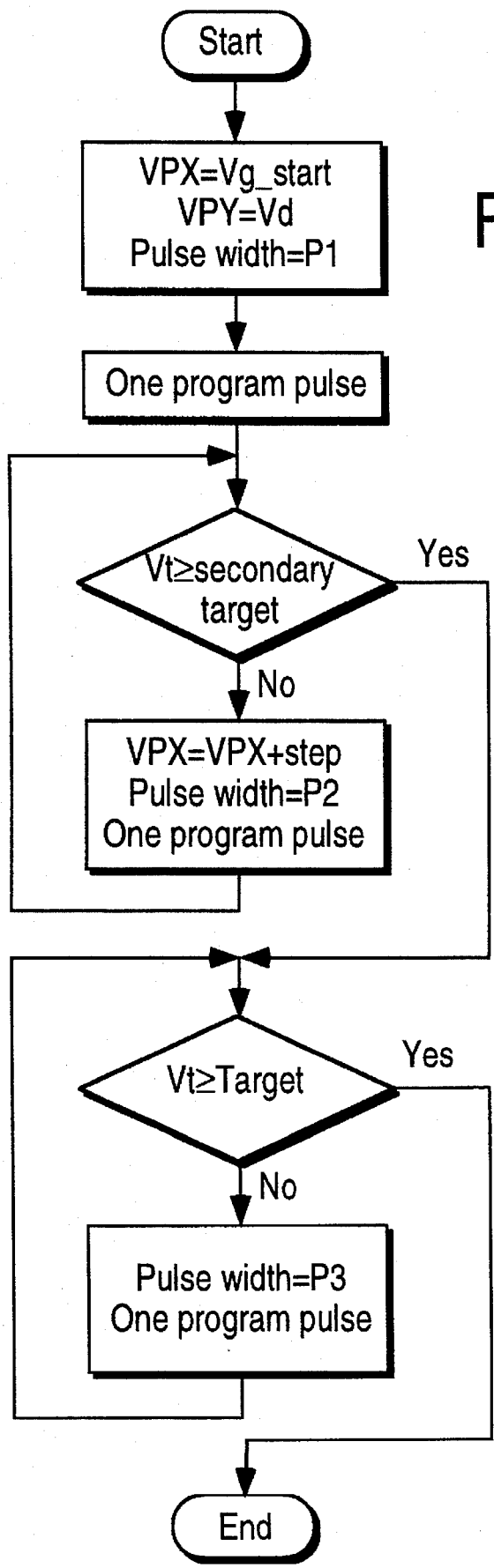
FIG. 7 is a flowchart illustrating a process for trimming reference cells in accordance with the present invention.

FIG. 7 illustrates a flow chart of a method in accordance with the present invention for rapidly programming the reference cells. In all of the steps, a constant drain voltage of Vpy is applied. In one embodiment, this is a value of 5.5 volts. In a first step, a gate voltage of a first value is applied for a period sufficient to store a charge which is sufficient to move the reference device into the saturated range of operation and brings the cell close to the secondary target. In one embodiment, the secondary threshold voltage target is 150 mv. below the value of the primary target. This voltage value will vary with the particular reference voltage which is desired. For example, to provide a reference value equivalent of a 3.5 volt threshold voltage in one embodiment, a gate voltage of 6.8 volts is utilized. Typically, this pulse is the longest of all pulses applied to the gate terminal of the reference device; in the embodiment mentioned above this pulse may be 40 microseconds in length. After the first pulse, the method moves to a step at which a test is conducted to determine if the threshold voltage is less than the secondary target. Essentially, this is accomplished by determining whether an output value at the sense amplifier has switched utilizing a test voltage applied through the device 37 as explained above which is 150 mv. below the value at which the threshold voltage Vt is to be set. If the secondary target has been reached as illustrated by a switch in the output of the sense amplifier, then the program moves to a step at which a test is conducted to determine whether the final and primary target threshold voltage has been reached. Again, this is accomplished by determining whether an output value at the sense amplifier has switched using a test voltage equal to the desired final voltage. If the final target has been reached, then the program moves to end. If, after the first pulse, the secondary target has not yet been reached, the program moves to a step at which a set of programming pulses are applied after each of which the switching value is tested to determine whether the secondary target value has been reached. Each of these pulses is of a duration shorter than the first pulse (about one-fourth in one embodiment or about 10 microseconds in length). These pulses are also increased slightly in voltage (by about one-tenth volt in one embodiment) with each new pulse so that the charge is moved toward the desired level by a Vt shift of approximately 100 mv. with each pulse. Thus, when the test signals that the Vt is equal to or greater than the secondary target, the value will still be at least 50 mv. less than the final value.

The final pulses are approximately one-tenth the length of the second set of pulses (1 microsecond in the embodiment described) and of a value equal to the voltage of the last pulse provided in the second set of pulses. Typically these pulses are chosen to move the value of Vt toward the desired final target by approximately 10 mv. or less per pulse. As will be seen, these pulses will gradually move the level of the charge to the final target. When the test signals that the Vt is equal to or greater than the final target, the value will still be within 10 mv. of the final value. In this manner the final charge value on the reference cells are reached very rapidly and the value reached is very precise. In one embodiment, each cell takes approximately 1 ms. to reach its final value.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for programming a non-volatile memory cell such that the non-volatile memory cell stores close to a target amount of charge, comprising:

a voltage switch coupled to a gate of the non-volatile memory cell; and a controller coupled to the voltage switch for controlling the voltage switch to apply charging pulses to the gate of the non-volatile memory cell until the non-volatile memory cell stores close to the target amount of charge, the controller controlling the voltage switch by causing the voltage switch to apply a first charging pulse having a first charging voltage to the non-volatile memory cell for a first duration such that the non-volatile memory cell stores a first amount of charge that is less than the target amount of charge;

causing the voltage switch to apply a second set of charging pulses to the non-volatile memory cell such that the non-volatile memory cell stores a second amount of charge that is less than the target amount of charge and greater than the first amount of charge, wherein each charging pulse of the second set of charging pulses is applied for a second duration that is less than the first duration, the controller causing the voltage switch to increase a second charging voltage of each charging pulse over an immediately previous pulse; and causing the voltage switch to apply a third set of charging pulses to the non-volatile memory cell such that the non-volatile memory cell stores a third amount of charge that is within an allowable variation of the target amount of charge, wherein each charging pulse of the third set of charging pulses is applied for a third duration that is less than the second duration.

2. The circuit of claim 1, further comprising:

a sense amplifier having a first terminal coupled to a drain of the non-volatile memory cell and a second terminal;

a circuit for supplying a reference voltage to the second terminal of the sense amplifier, the controller selecting a first value for the reference voltage, the first value corresponding to a memory cell that stores the second amount of charge, after applying the first charging pulse, the controller closing the switch and the sense amplifier testing the non-volatile memory cell in response to the switch closing to determine whether the first amount of charge exceeds the second amount of charge, wherein the step of applying the second set of charging pulses is not performed if the first amount of charge exceeds the second amount of charge, after applying each charging pulse of the second set of charging pulses, the controller closing the switch and the sense amplifier testing the non-volatile memory cell to determine whether the non-volatile memory cell stores the second amount of charge, wherein the charging pulses of the second set of charging pulses continue to be applied until the non-volatile memory cell is determined as storing the second amount of charge, the controller selecting a second value for the reference voltage after the non-volatile memory cell is determined as storing the second amount of charge, the second value corresponding to a memory cell that stores the third amount of charge;

after applying each charging pulse of the third set of charging pulses, the controller closing the switch and the sense amplifier testing the non-volatile memory cell to determine whether the non-volatile memory cell stores the third amount of charge, wherein the charging pulses of the third set of charging pulses continue to be applied until the non-volatile memory cell is determined as storing the third amount of charge, wherein the controller opens the switch after each testing step.

3. The circuit of claim 1, wherein a charging voltage of each charging pulse of the second set of charging pulses is greater than a charging voltage of an immediately previous charging pulse.

4. The circuit of claim 1, wherein the first charging voltage and the first duration are selected such that a flash EEPROM memory cell is placed in a saturation range.

5. The circuit of claim 1, wherein the second duration is approximately one-fourth the first duration, and the third duration is approximately one-tenth the second duration.

6. The circuit of claim 5, wherein a charging voltage of each charging pulse of the second set of charging pulses is one-tenth volt greater than a charging voltage of an immediately previous charging pulse.

* * * * *